United States Patent
Dutta et al.

[11] Patent Number: 5,861,636
[45] Date of Patent: Jan. 19, 1999

[54] SURFACE EMITTING VISIBLE LIGHT EMITING DIODE HAVING RING-SHAPED ELECTRODE

[75] Inventors: Achyut Kumar Dutta; Akira Suzuki, both of Tokyo, Japan

[73] Assignee: NEC Corporation, Tokyo, Japan

[21] Appl. No.: 629,470

[22] Filed: Apr. 11, 1996

[30] Foreign Application Priority Data

Apr. 11, 1995 [JP] Japan ................................. 7-085128

[51] Int. Cl.$^6$ ..................................................... H01L 33/00
[52] U.S. Cl. ................................. 257/91; 257/95; 257/98; 257/99; 257/100
[58] Field of Search ................................. 257/91, 94, 95, 257/98, 99, 100

[56] References Cited

FOREIGN PATENT DOCUMENTS 3-190287 8/1991 Japan .
4-174567 6/1992 Japan .
4-259263 9/1992 Japan .

*Primary Examiner*—Minh Loan Tran
*Attorney, Agent, or Firm*—Sughrue, Mion, Zinn, Macpeak & Seas, PLLC

[57] ABSTRACT

Disclosed is a surface emitting visible light emitting diode, which has: a first conductivity-type substrate; and a first conductivity-type buffer layer, a first conductivity-type cladding layer, an active layer, a second conductivity-type cladding layer, a second conductivity-type current spreading layer and a second conductivity-type cap layer which are in turn grown on the substrate; wherein the second conductivity-type cap layer has a ring shaped electrode formed thereon.

2 Claims, 16 Drawing Sheets

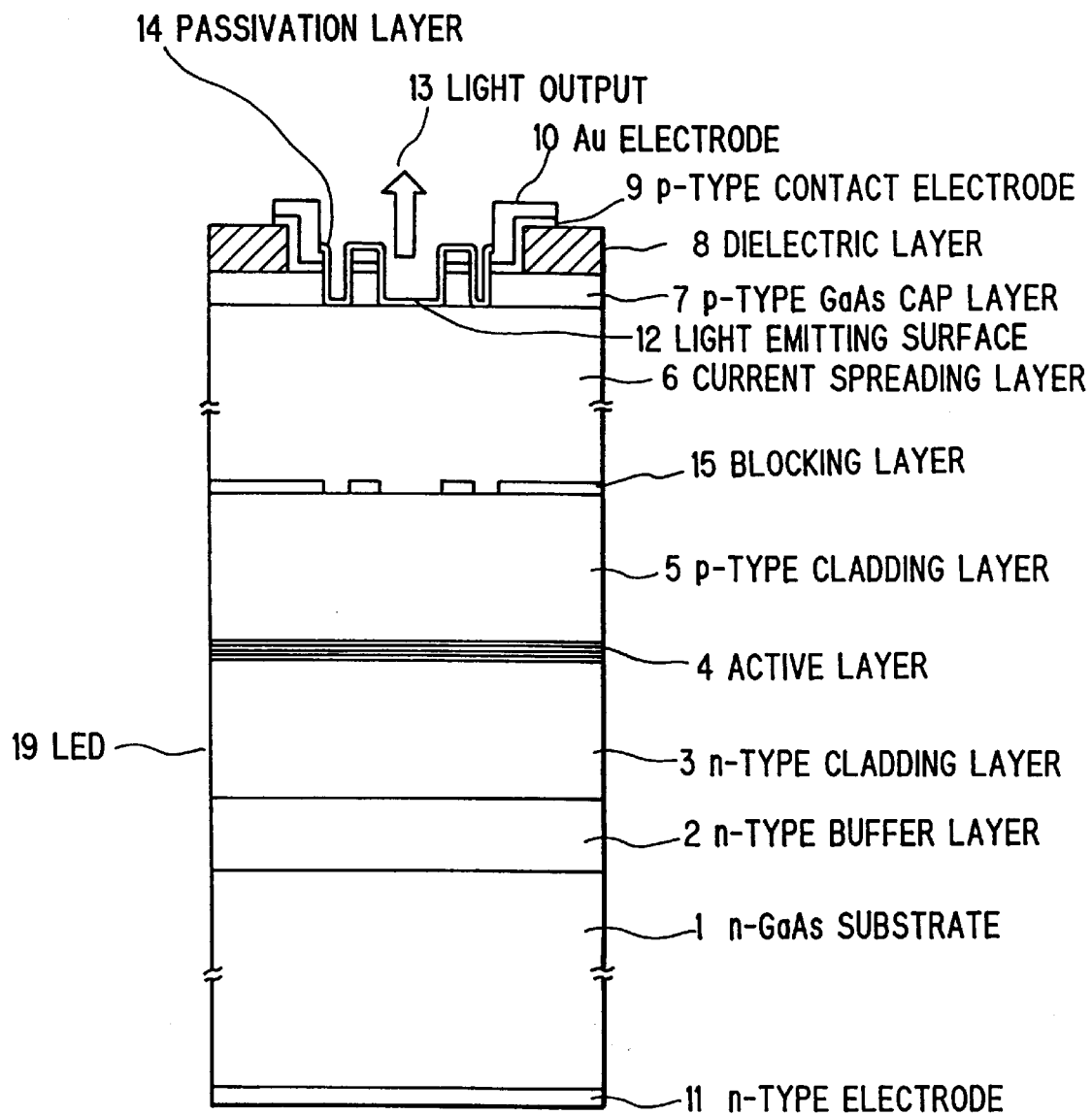

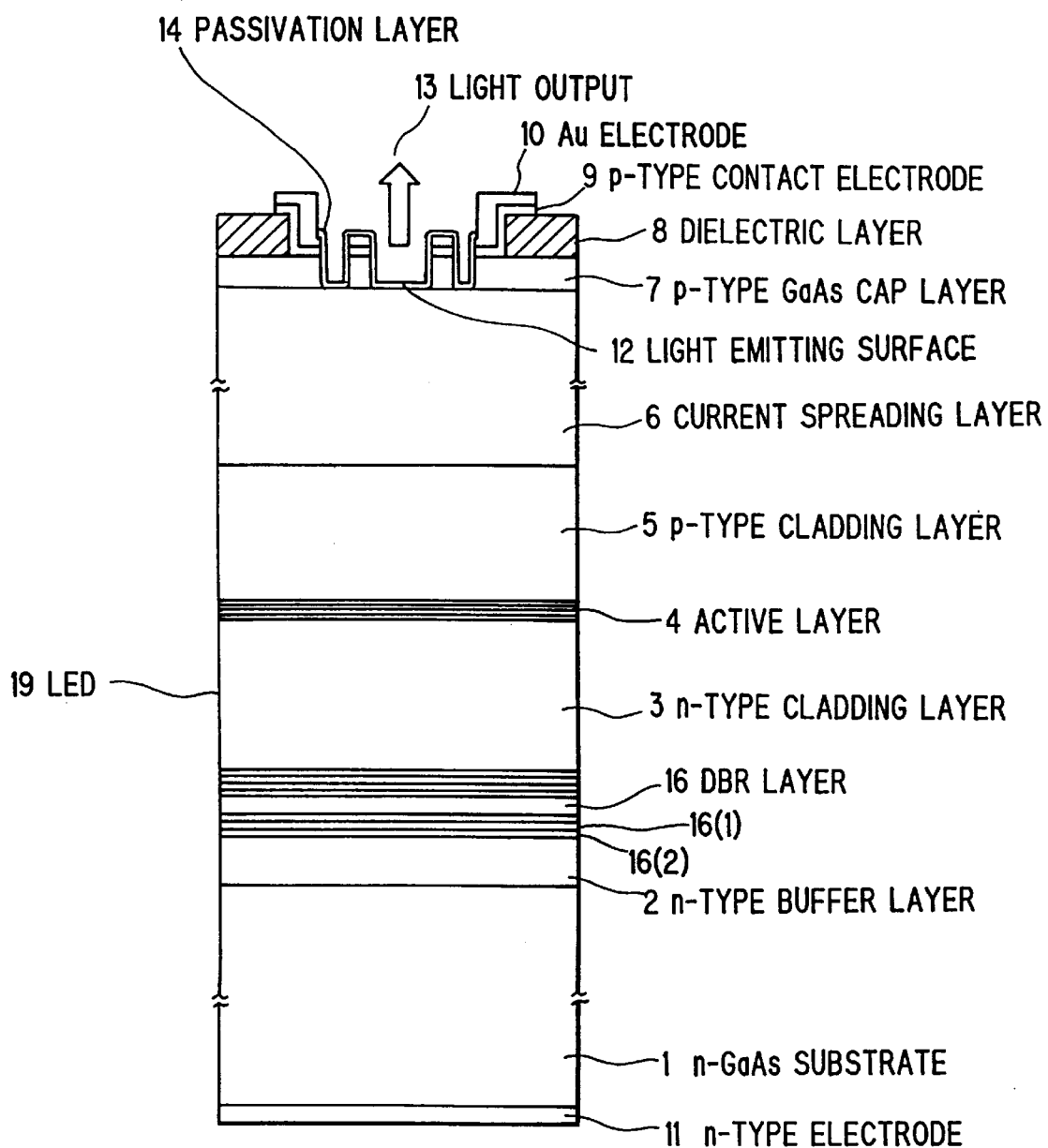

23 2-DIMENSIONAL LED ARRAY 24 2-DIMENSIONAL LED ARRAY

SURFACE EMITTING VISIBLE LIGHT EMITING DIODE HAVING RING-SHAPED ELECTRODE

FIELD OF THE INVENTION

This invention relates to a surface emitting visible light emitting diode, and more particularly to, a surface emitting visible light emitting diode which is used as an optical source in a POF(plastic optical fiber) based optical data link system and also as an outdoor display or automobile indicator.

BACKGROUND OF THE INVENTION

A conventional surface emitting visible light emitting diode(hereinafter also referred to as 'surface emitting visible LED') generally has a top electrode with a square or circular shape which is located at the center of the light emitting surface of LED. In the conventional surface emitting visible LED, the external quantum efficiency is dependent on the structure of the LED and the shape of an electrode for spreading current into the junction. To enhance the light output, the electrode area needs to be as small as possible and the light emitting surface needs to be as wide as possible.

Though the conventional surface emitting visible LED allows easiness in fabrication, it causes the disruption of a gaussian type beam output, broadening the beam with light emission concentrated around the electrode. The emitted light intensity gets decreased as the distance from the electrode gets increased. This is because the current is almost centrally crowded and is not distributed far away from the electrode. The light intensity achieved is directly proportional to the current density obtained at the point. This type of LED with broad light beam cannot be implemented in the optical data-link system, because the coupling efficiency even with a larger core fiber is low due to its beam divergence.

For example, known is a conventional surface emitting visible LED, which comprises a n-type buffer layer, a n-type cladding layer, an active layer, a p-type cladding layer, a current spreading layer and a p-type cap layer which are in turn grown on a n-type GaAs substrate. On the cap layer, an electrode composed of square or circular shaped metal is formed.

Observing an approximated near field pattern of the light emitted from the light emission surface of the conventional surface emitting visible LED, it is proved that the light intensity is maximum around the electrode and gets lowered at the position far away from the electrode, which indicates that the spreading of current is mainly crowded under the electrode contact. Thus, the light output obtained could not be enhanced as expected. To avoid this current crowding around the electrode, a blocking layer is conventionally employed which is formed prior to the growth of the current spreading layer.

However, this type of LED needs the two step layer growth, which needs further time and increases the production cost. In addition, the darkness at the center portion due to the circular shaped electrode reduces the coupling efficiency even with a larger core fiber.

Many papers and Japanese patent applications disclose concerning III-V semiconductors based visible LED which has a wavelength range from 580 to 670 nm. In every case, the electrodes for current spreading have a square or circular shape and are located at the center of LED. One typical example is disclosed in Sugawara et al., Japan Journal of Applied Physics, part 1, Vol.1, No.8, pp.2446–2451. In this report, a cross shaped electrode is used in the top emitting LED for spreading the current. A blocking layer is also used to prevent the current from crowding under the contact. The light output achieved by the cross shaped electrode is still below the level necessary for the optical data link system. To increase the current spreading outside the contact, a thick window layer with a low resistivity is needed. However, even with this thick window layer, the current spreading outside the contact is limited up to a certain level and the light intensity is not enough for practical application.

This type of LED may have no problem for use in the outdoor application. However, in an application such as a short distance data link system, especially based on POF, the use of this conventional LED with the square, circular or cross shaped electrode usually exhibits low coupling efficiency to be completely impractical in the POF based communication system. For the POF based data link system, it would be highly desirable to design a LED which exhibits not only high brightness but also high coupling efficiency.

Japanese patent application laid-open No.2-174272 (inventor: Kim) discloses a high brightness LED. In this LED, the brightness is enhanced by employing a n-p-n-p structure under a contact, since the current crowded under the contact can be spread to the light emitting surface. The main drawback of this LED is that prior to making a p-contact a mesa structure up to an active region is formed in the light emitting surface to make a current path and also dopant-like zinc(Zn) is diffused at a high ambient temperature. The mesa formation up to the active region and also the post growth high temperature for Zn diffusion may have an influence on its performance characteristics. As the emitting surface has a high p-doping a large fraction of the light (depending on the light energy) might be absorbed in the emitting surface. In fabrication of this type of LED, it needs to go through several processes to make the LED fabrication cost higher. Further, it is difficult to make this type of LED high speed because of the large capacitance induced due to the contact area which is proportional to the LED size.

Japanese patent application laid-open No.3-190287 (inventor:Tajiri) also discloses a high brightness LED array. In this LED, to facilitate the wire bonding, a contact is made on the upper layer following the mesa formation. In this case, the shape of the contact is changed to achieve a high light output. Since this device is closely related to a LED array and the mesa structure is needed prior to the formation of electrode, there will be difficulties to form the electrode unless a thick contact region is provided. Therefore, the cost of LED fabrication increases and it is completely impractical for a single LED to be made.

Japanese patent application laid-open No. 4-174567 (inventors: Kato et al.) discloses a high brightness LED array for the use of a printer. This LED is provided with a bottom distributed Bragg reflector(DBR) for reflecting the light returned from a substrate. In this case, the same idea as in the fabricating of a surface emitting laser is implemented. In this DBR, pairs of GaAs/AlAs were used for reflecting 880 nm wavelength light emitted towards a substrate. The type and number of the pairs in this DBR are dependent on the wavelength of output light and this type of DBR cannot be used in a visible LED where 600 to 650 nm wavelengths are to be considered. This type of LED array could be used for a printer, but it cannot be implementable in another application such as in a data link system. This is because the shape of a top electrode is the same as that of the previously mentioned conventional LED therefore resulting in providing a very low coupling efficiency to a fiber.

Japanese patent application laid-open No. 4-259263 (inventors: Nitta et al.) discloses a InAlGaP based visible LED. In this LED, to avoid the Zn diffusion into an active region, an additional layer of InGaP is employed which has a bandgap greater than that of the active region layer. No additional layer for current spreading is used. However, as described previously, this type of visible LED with a circular shaped electrode centrally located is not useful in a short distance data link system.

As explained above, the conventional LEDs have drawbacks that a sufficient light output and coupling efficiency cannot be obtained in the short distance data link system, especially in the POP based data system.

SUMMARY OF THE INVENTION

Accordingly, it is an object of the invention to provide a surface emitting visible LED by which a high light output and a high coupling efficiency to an optical fiber can be obtained.

According to the invention, a surface emitting visible light emitting diode, comprises:
- a first conductivity-type substrate; and a first conductivity-type buffer layer, a first conductivity-type cladding layer, an active layer, a second conductivity-type cladding layer, a second conductivity-type current spreading layer and a second conductivity-type cap layer which are in turn grown on the substrate;
- wherein the second conductivity-type cap layer has a ring shaped electrode formed thereon.

In accordance with the invention, the shape of the electrode is properly designed to distribute the current on the emitting surface. When the ring shaped electrode with an optimized diameter on the emitting surface is used, the current can be uniformly distributed over the emitting surface. In the use of a large emitting surface, two or more rings may be employed to keep the uniform current spreading. Both the speed and the light output of LED are dependent on the number of rings and the distance between the rings. Thus, by optimizing these factors, the light output can be maximized and the speed can be enhanced. Also, the use of the ring shaped electrode can allow the light to be collected at the central portion to enhance the coupling efficiency to the POF and the speed of the LED.

BRIEF DESCRIPTION OF THE DRAWINGS

The invention will be explained in more detail in conjunction with the appended drawings, wherein:

FIG. 6 is a cross sectional view showing a surface emitting visible LED in a second preferred embodiment according to the invention, FIG. 7 is a cross sectional view showing a surface emitting visible LED in a third preferred embodiment according to the invention.

DESCRIPTION OF THE PREFERRED EMBODIMENTS

Before explaining a surface emitting visible LED in the preferred embodiment, the aforementioned conventional LED will be explained in FIGS. 1 to 3.

Figure 1A:
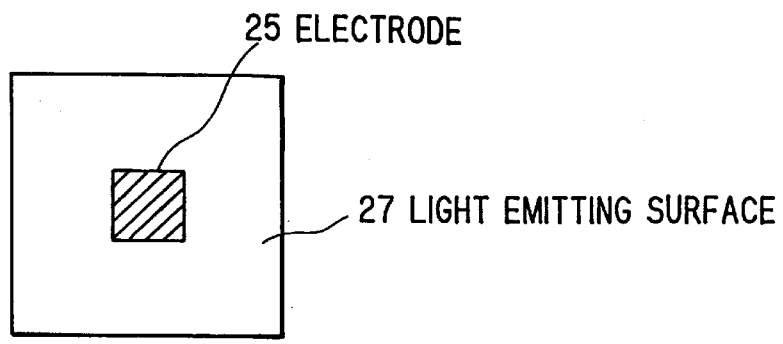
FIGS. 1A and 1B are top and cross sectional views showing a conventional surface emitting visible LED.
Figure 1B:
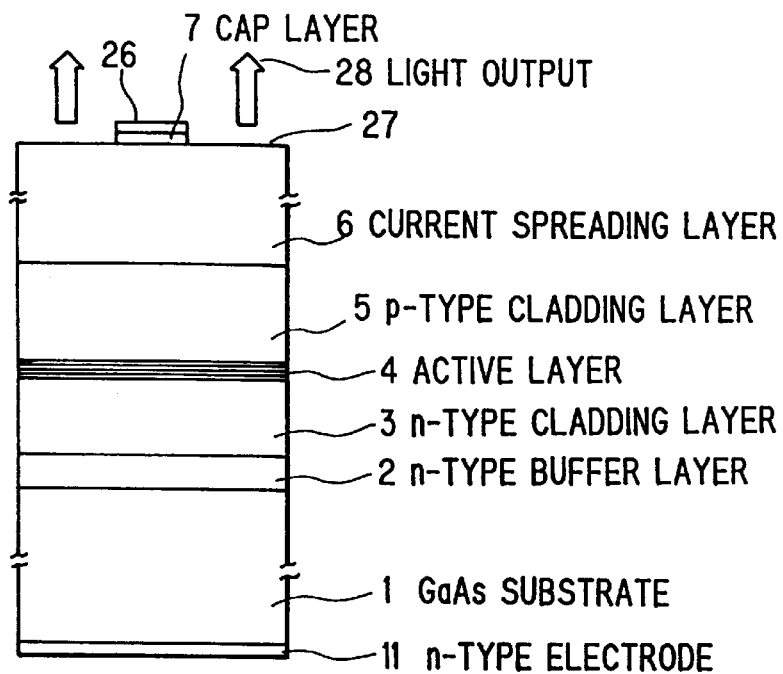

FIGS. 1A and 1B are top and cross sectional views showing an example of the conventional surface emitting visible LED. As shown in FIGS. 1A and 1B, n-type GaAs buffer layer 2, n-type $(Al_xGa_{1-x})_xIn_{1-x}P$ layer 3, active layer 4, p-type$(Al_xGa_{1-x})_{0.5}In_{0.5}P$ layer 5, current spreading layer 6 and p-type GaAs cap layer 7 are in turn grown on a n-type GaAs substrate 1. On the p-type GaAs cap layer 7, an electrode 25 composed of square or circular shaped metal 26 is formed. As the current spreading layer 6, thick $Al_{0.8}Ga_{0.9}As$ is usually used.

Figure 2:
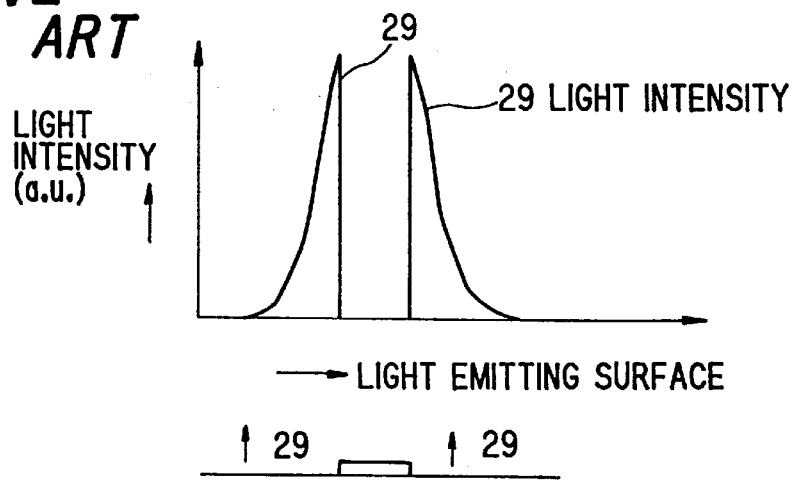
FIG. 2 is an explanatory diagram showing an approximated near field pattern of the light emitted from the light emission surface of the LED in FIGS. 1A and 1B.
Figure 3:
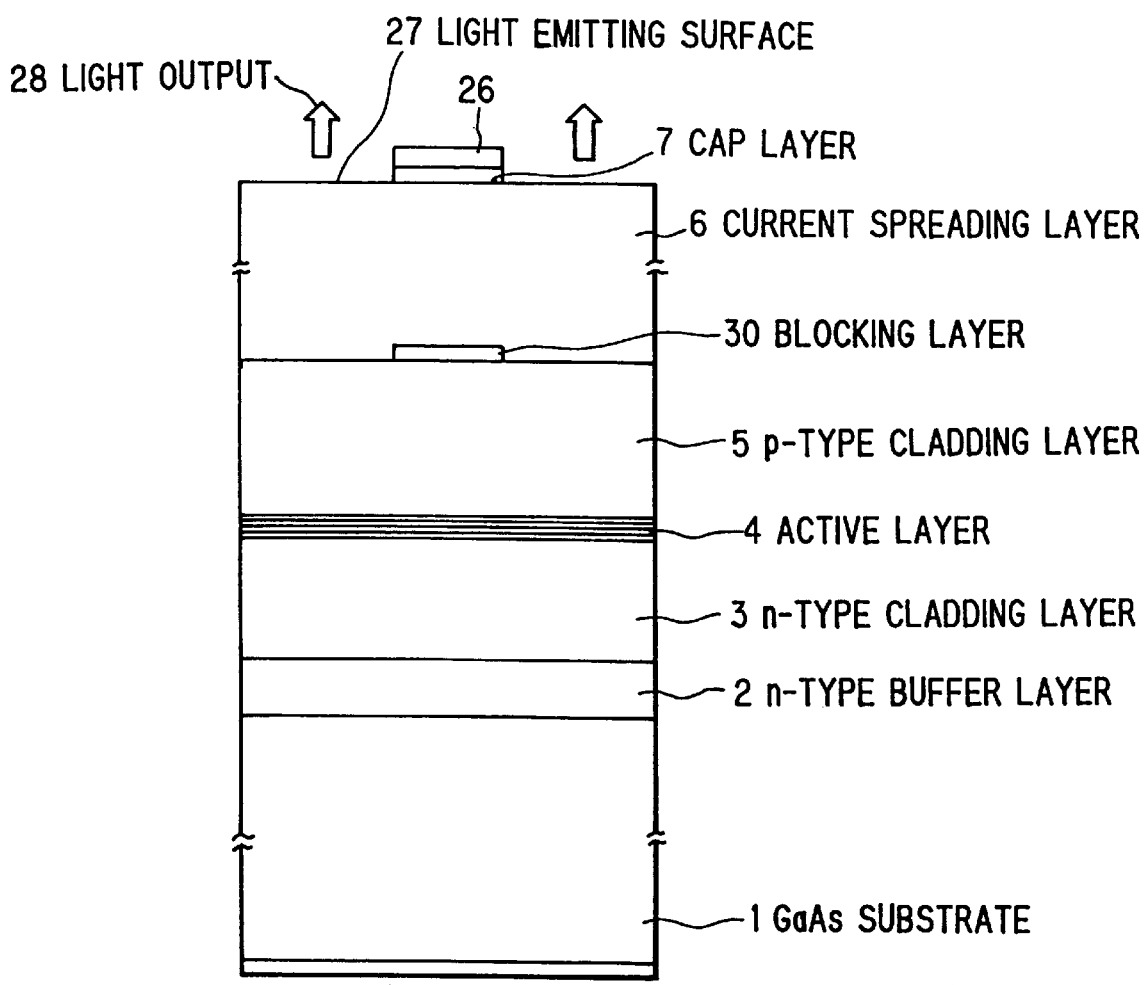
FIG. 3 is a cross sectional view showing another conventional surface emitting visible LED.

FIG. 2 shows an approximated near field pattern of the light emitted from the light emission surface 27 of the above LED. In FIG. 2, as described above, it is proved that the light intensity 29 is maximum around the electrode 25 and gets lowered at the position far away from the electrode 25, which indicates that the spreading of current is mainly crowded under the electrode contact. Thus, the light output 28 could not be enhanced as expected.

In order to avoid this current crowding around the electrode, a blocking layer is conventionally employed which is formed prior to the growth of the AlGaAs (spreading) layer 6. FIG. 3 shows a conventional surface emitting visible LED with the blocking layer 30. This type of LED needs the two step layer growth.

Next, a surface emitting visible light emitting diode in the first preferred embodiment will be explained in FIG. 4, wherein like parts are indicated by like reference numerals as used in FIGS. 1B and 3.

Figure 4:
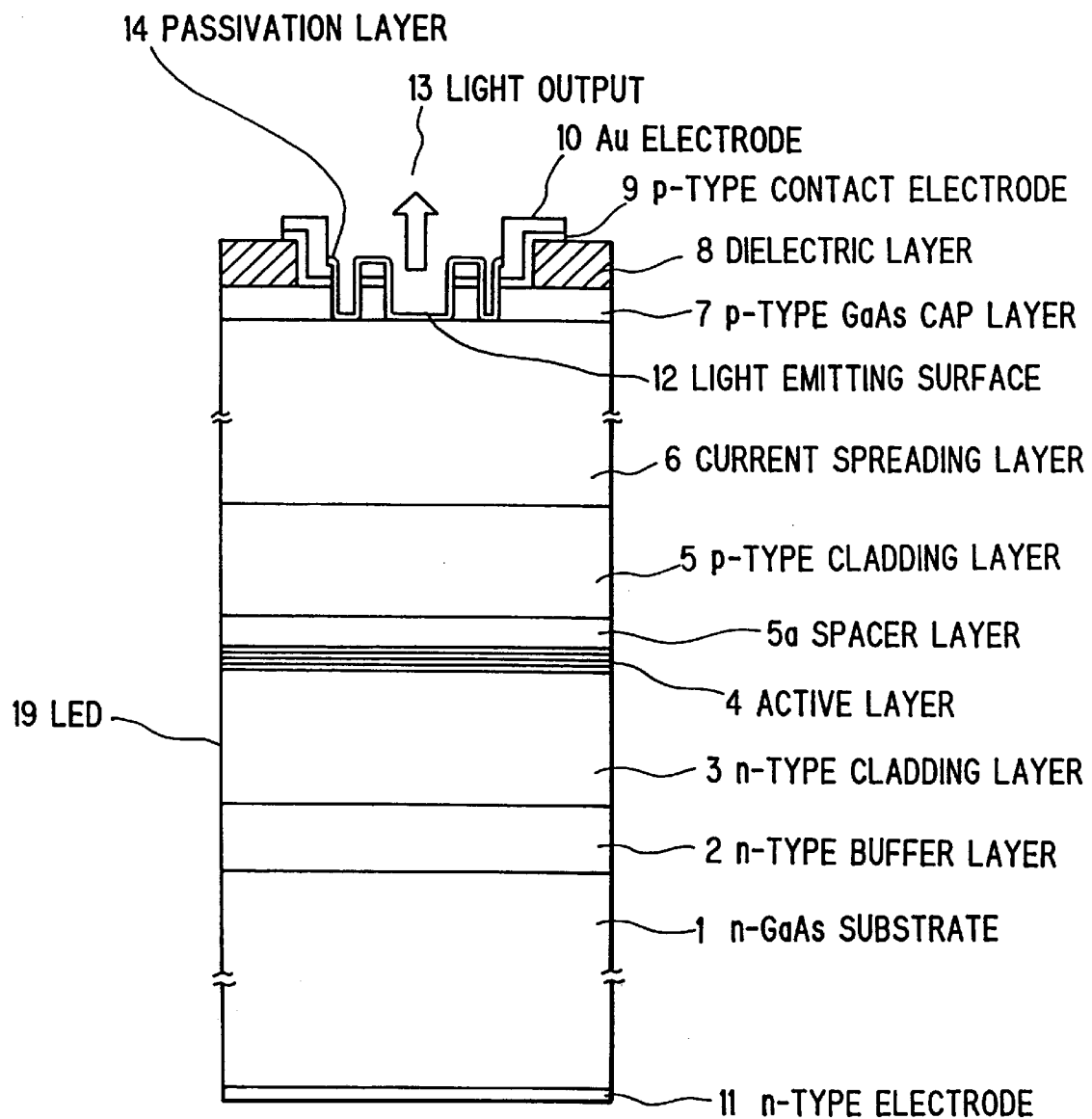
FIG. 4 is a cross sectional view showing a surface emitting visible LED in a first preferred embodiment according to the invention.

FIG. 4 shows a surface emitting visible light emitting diode in the first embodiment. As shown in FIG. 4, n-type GaAs buffer layer 2, n-type $(Al_{0.7}Ga_{0.3})_{0.5}In_{0.5}P$ cladding layer 3, active layer 4, p-type $(Al_{0.7}Ga_{0.3})_{0.5}In_{0.5}P$ cladding layer 5, current spreading layer 6 and high doped p-type GaAs cap layer 7 are subsequently grown on a n-type GaAs substrate 1. As the active layer 4, bulk or multiquantum well of $(Al_xGa_{1-x})_{0.5}In_{0.6}P$ based material with a desired wavelength can be used. As the current spreading layer 6, high doped p-type III-V based semiconductors having a band gap higher than that of used as the active layer 4 and also having a lattice constant similar to that of its underlying p-type cladding layer 5 can be used.

It should be noted here that since the high doping is necessary in the thick current spreading layer 6 and cap layer 7 during the epitaxial growth, the dopant diffusion into the active layer 4 may deteriorate the optical characteristics of LED. In order to prevent the dopant from diffusing into the active layer 4, the low doped spacer layer 5a with a thickness dependent on the thickness of the current spreading layer 6 and cap layer 7 is formed following the formation of the active layer 4. As the spacer layer 5a, the same type of low doped materials as the p-type cladding layer 5 can be used.

After the epitaxial growth, a dielectric layer 8 with over 150 nm thickness of silicon nitride, silicon dioxide or the like is deposited at a temperature below 300° C.

Figure 5A:
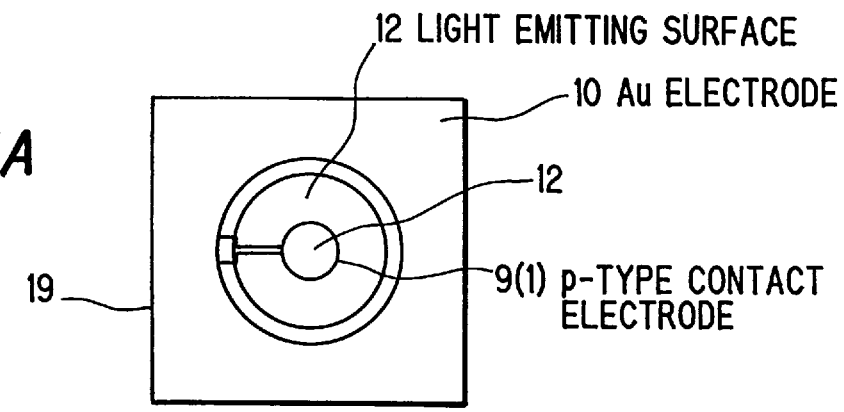
FIGS. 5A to 5C are top views showing ring shaped electrodes employed in the first embodiment.
Figure 5B:
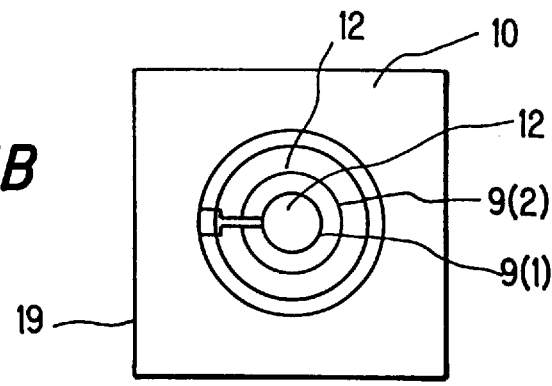
Figure 5C:
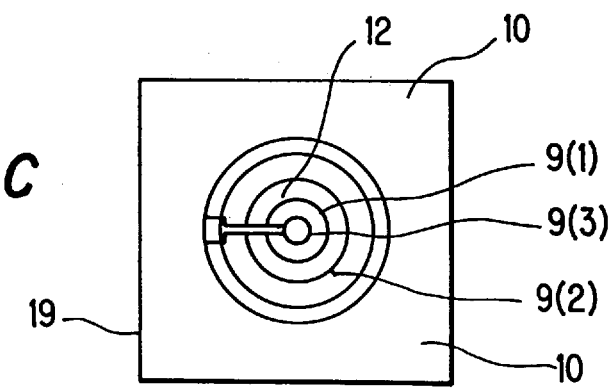

This is followed by opening the window through the dielectric layer 8 to provide a light emitting surface 12. Then, a p-type contact electrode 9 is formed using the lift-off process. The top view of the electrode 9 is as shown in FIGS. 5A to 5C.

In LED's, since the current density is higher than that of optical devices such as a laser diode, the contact resistance mainly induced due to the p-type contact electrode 9 should be as low as 1 ohm for its reliable long time operation. For this reason, in the formation of the p-type contact electrode 9, the more reliable metallization is to be selected in avoiding any spike formation in the GaAs cap layer 7. For the p-type contact electrode 9, Au:Zn or Ti/Pt/Au can be used to provide the reliability higher than the conventional type metallization such as Cr:Au.

When an LED is used in the data link system, the optical coupling efficiency of LED to the fiber is of more concern. Therefore, the light emitting surface should be designed such that after the coupling more light can emit into the fiber.

The coupling efficiency is mainly dependent on several factors such as the type of a fiber used and the emitting surface of LED used. In surface emitting visible LED, the emitting surface needs to be designed such that more light is concentrated on the center region rather than the outer region of the surface. This is more dependent on the top shape of an electrode. Namely, the coupling efficiency can be maximized by optimizing the top shape of an electrode.

As explained previously, in the conventional surface emitting visible LED in which electrodes mainly are located at the center portion of the surface, the output light is broadened to the outer region of the surface to lower the coupling efficiency.

When ring shaped electrodes as shown in FIGS. 5A to 5C according to the invention are used, the light can be made to concentrate on the center of LED, which can provide the coupling efficiency higher than that of the conventional LED.

The design of the ring is also another factor for enhancing the coupling efficiency. In general, to achieve the maximum coupling efficiency(50% or more) to the fiber, the ring diameter should be designed such that the ratio of the fiber core diameter to the emitting surface is greater than 5. For example, when the step index(SI) type POF fiber with core size of 0.98 mm and numerical aperture(NA) of 0.5 is used, the ring diameter is to be less than about 100 $\mu$m to achieve the coupling efficiency over 70%.

Also, in order to enhance the output power, the width of the ring should be as low as possible. Since the contact resistance is dependent on its contact area, two or three rings as shown in FIGS. 5B to 5C may be used to improve the contact resistance.

After making the p-type contact electrode 9, to facilitate the wire bonding, an Au electrode 10 is plated on the p-type contact electrode 9 or partially on the portion where the wire bonding is laid.

Then, the light emitting surface 12 is covered with a passivation layer 14. The passivation layer 14, which can be made of alumina($Al_2O_3$), silicon dioxide($SiO_2$) or silicon nitride($SiN_x$), is deposited at a room temperature or a temperature less than 200° C. The passivation layer 14 can prevent the light emitting surface 12 from absorbing water molecules or oxygen from the environment and enhance the device reliability in long time operation.

After forming the passivation layer 14, the backside of the substrate 1 is polished to around 100 $\mu$m to form a n-type contact region 11 thereon. The n-type contact region 11 can be made of Au:Ge/Ni/Au. After forming the n-type contact region 11 on the backside of the substrate 1 polished, each LED is scribed for packaging. The ring shaped electrode in LED according to invention not only improves the light output power and coupling efficiency but also reduces the fabrication cost of the LED.

FIG. 6 shows a surface emitting visible light emitting diode in the second preferred embodiment according to the invention, wherein like parts are indicated by like reference numerals as used in FIG. 4, so that repeated explanation is omitted here.

In the second embodiment, for fabricating LED, two step epitaxial growth is necessary. After growing the p-type cladding layer 5, a blocking layer 15 is grown, which is followed by the formation of a pattern thereof. The blocking layer 15 helps to prevent the current from crowding under the contact. As the blocking layer 15, the same n-type materials as the cladding layer 3 can be used. After patterning the blocking layer 15, the current spreading layer 6 and high doped Ga bs cap layer 7 for p-type contact region are grown.

The other process following this step is carried out as described in the first embodiment, so that explanation thereof is omitted here. Here, it should be noted that the p-type contact electrode 9 be made at the position just below the pattern of the blocking layer 15. The use of the blocking layer 15 with the ring shape top electrode in the p-type contact region helps to enhance the light output.

FIG. 7 shows a surface emitting visible light emitting diode in the third preferred embodiment according to the invention, wherein like parts are indicated by like reference numerals as used in FIGS. 4 and 6, so that repeated explanation is omitted here.

In the third embodiment, n-type distributed Bragg reflector(DBR) mirror 16 is grown on the n-buffer layer prior to growing the cladding layer 3, active layer 4 and current spreading layer 6. DBR to be used as a mirror consists of semiconductor pairs 16(1) and 16(2) having high refractive index differences. The number and type of the pairs also determine the amount of the light reflected back from the DBR mirror 16. The semiconductor layers to be used as DBR should also have low absorbency with respect to the light emitting from the active region.

Figure 8A:
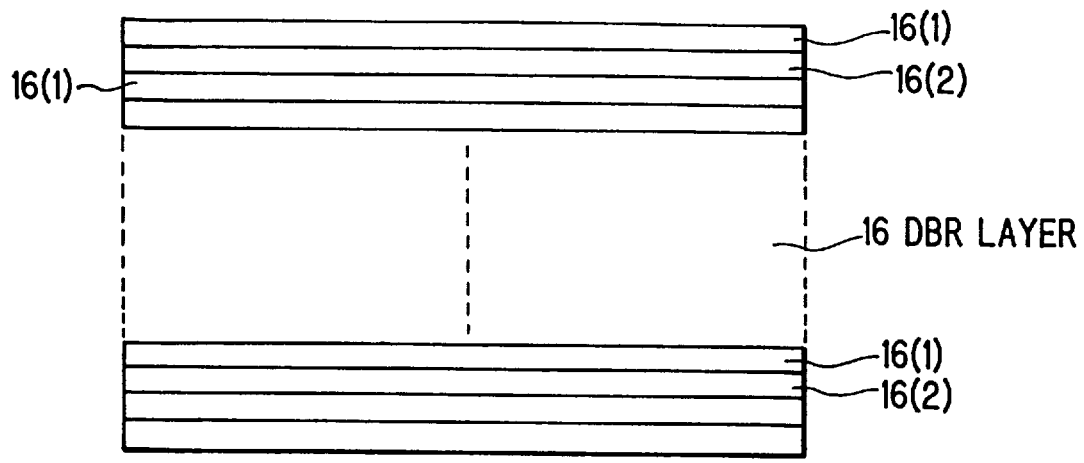
FIGS. 8A and 8B are explanatory diagrams showing a structure of the DBR layer in the surface emitting visible LED in the third and a fourth preferred embodiment and its approximated reflecting characteristics.
Figure 8B:
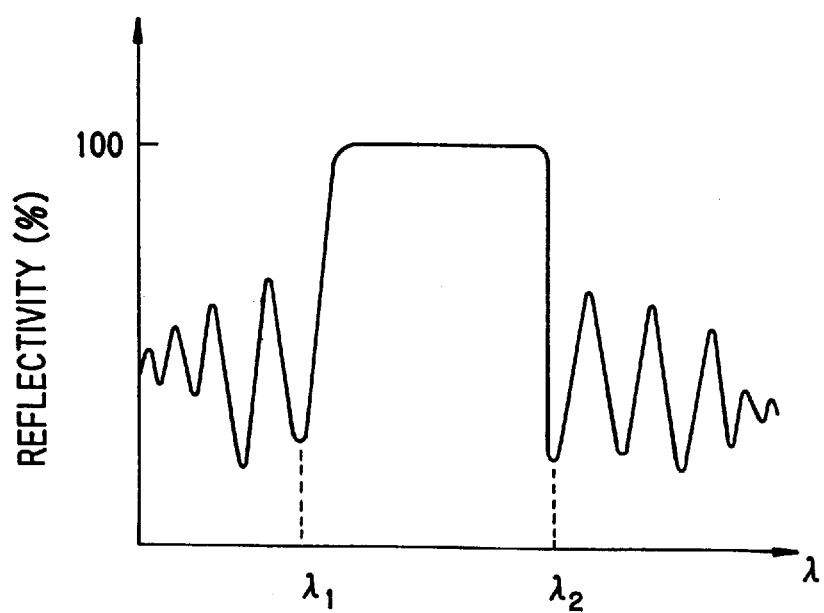

FIGS. 8A and 8B show a structure of the DBR layer 16 and its approximated reflecting characteristics. As explained previously, the number and type of the semiconductor to be used in the pairs are dependent on the output light wavelength. In optical devices such as a surface emitting visible LED, since the emission spectra covers a broad wavelength, the type of a semiconductor to be used in the pairs should be selected such that maximum reflectivity can be obtained in the broad wavelength. As shown in FIG. 8B, a wavelength range from $\lambda_1$ to $\lambda_2$ is necessary to achieve the maximum light reflectivity. For example, in designing an LED of 650 nm, the use of 15 pairs of AlAs/$(Al_{0.5}Ga_{0.5})_{0.5}In_{0.5}P$ can reflect 100% light within the wavelength range from 590 to 710 nm. Table 1 summarizes the types and reflection characteristics of DBR pairs useful to design a surface emitting visible LED.

TABLE 1

| pair type | number of pairs | reflectivity (%) | wavelength range $\lambda_1$–$\lambda_2$ (nm) |
|---|---|---|---|
| AlAs/$Al_{.5}Ga_{.5}As$ | $\geq 20$ | 99.9 | 620–685 |
| $Al_{.5}In_{.5}P$/$(Al_{.5}Ga_{.5})_{.5}In_{.5}P$ | $\geq 15$ | 99.9 | 605–700 |
| $Al_{.6}In_{.5}P$/$Ga_{.5}In_{.5}P$ | $\geq 25$ | 99.9 | 625–680 |
| AlAs/$(Al_{.6}Ga_{.5})_{.5}In_{.5}P$ | $\geq 12$ | 99.9 | 590–710 |
| AlAs/GaAs | $\geq 15$ | 90.0 | 620–660 |

In designing DBR, the formation of the parabolic or graded junction to minimize the resistance is as important as the reflection characteristics. For making the graded DBR junction, superlattice or graded junction to match with the pairs as shown in Table 1 can be used. Following the formation of DBR 16, the other layers such as a n-type cladding layer 3, active layer 4, p-type cladding layer 5, current spreading layer 6 and p-type GaAs cap layer 7 are grown in a single chamber. The other process following this step are the same as described in the first embodiment, so that repeated explanation is omitted here.

Figure 9:
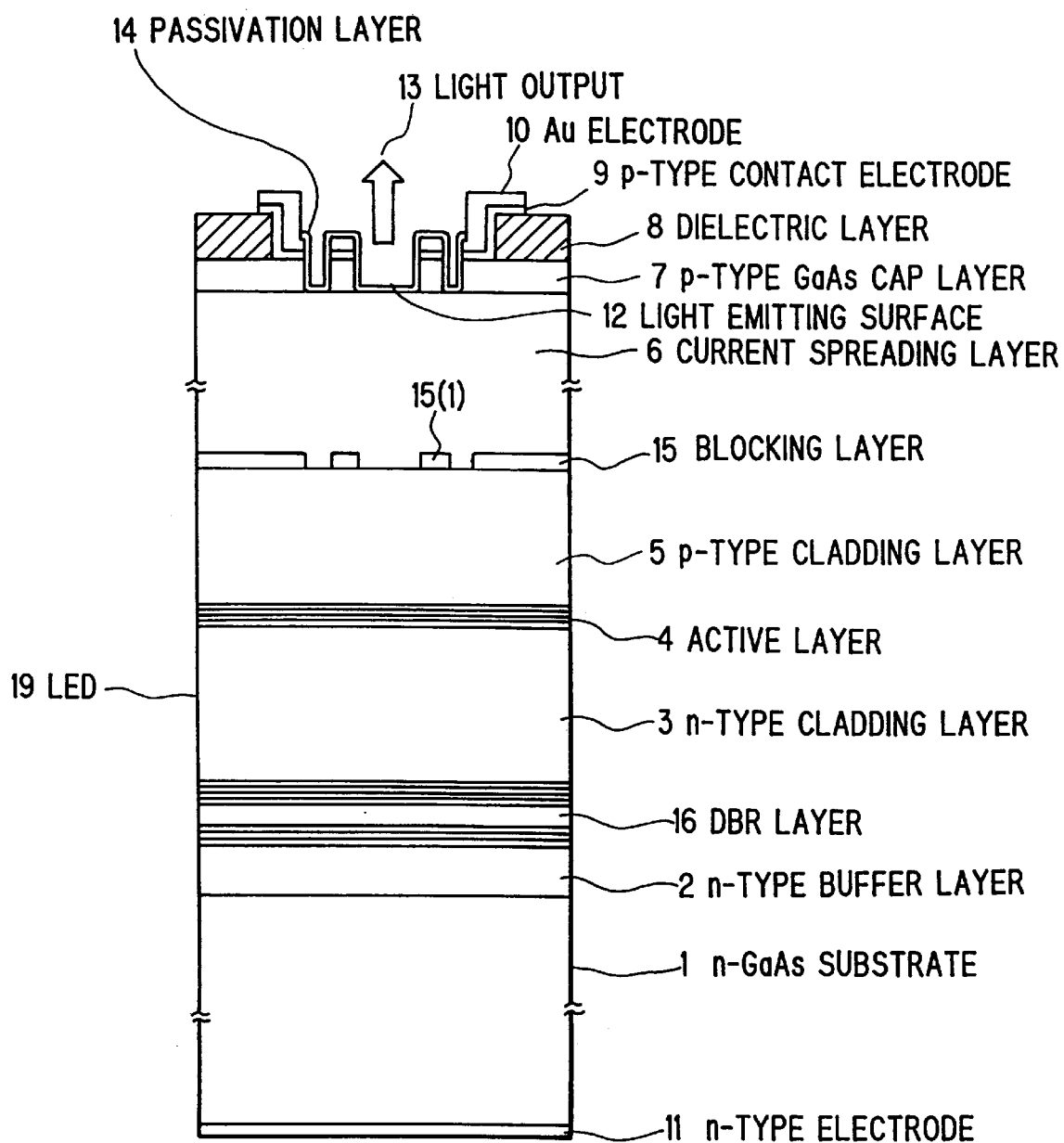
FIG. 9 is a cross sectional view showing a surface emitting visible LED in a fourth preferred embodiment according to the invention.

FIG. 9 shows a surface emitting visible light emitting diode in the fourth preferred embodiment according to the invention, wherein like parts are indicated by like reference numerals as used in FIGS. 4, 6 and 7, so that repeated explanation is omitted here.

In the fourth embodiment, after forming DBR 16, a n-type cladding layer 3, active layer 4, p-type cladding layer 5 and blocking layer 15 are in turn grown. The blocking layer pattern 15(1) is also made at the position of a p-type contact electrode 9. The process following this step is the same as described in the second embodiment, so that repeated explanation is omitted here.

Figure 10:
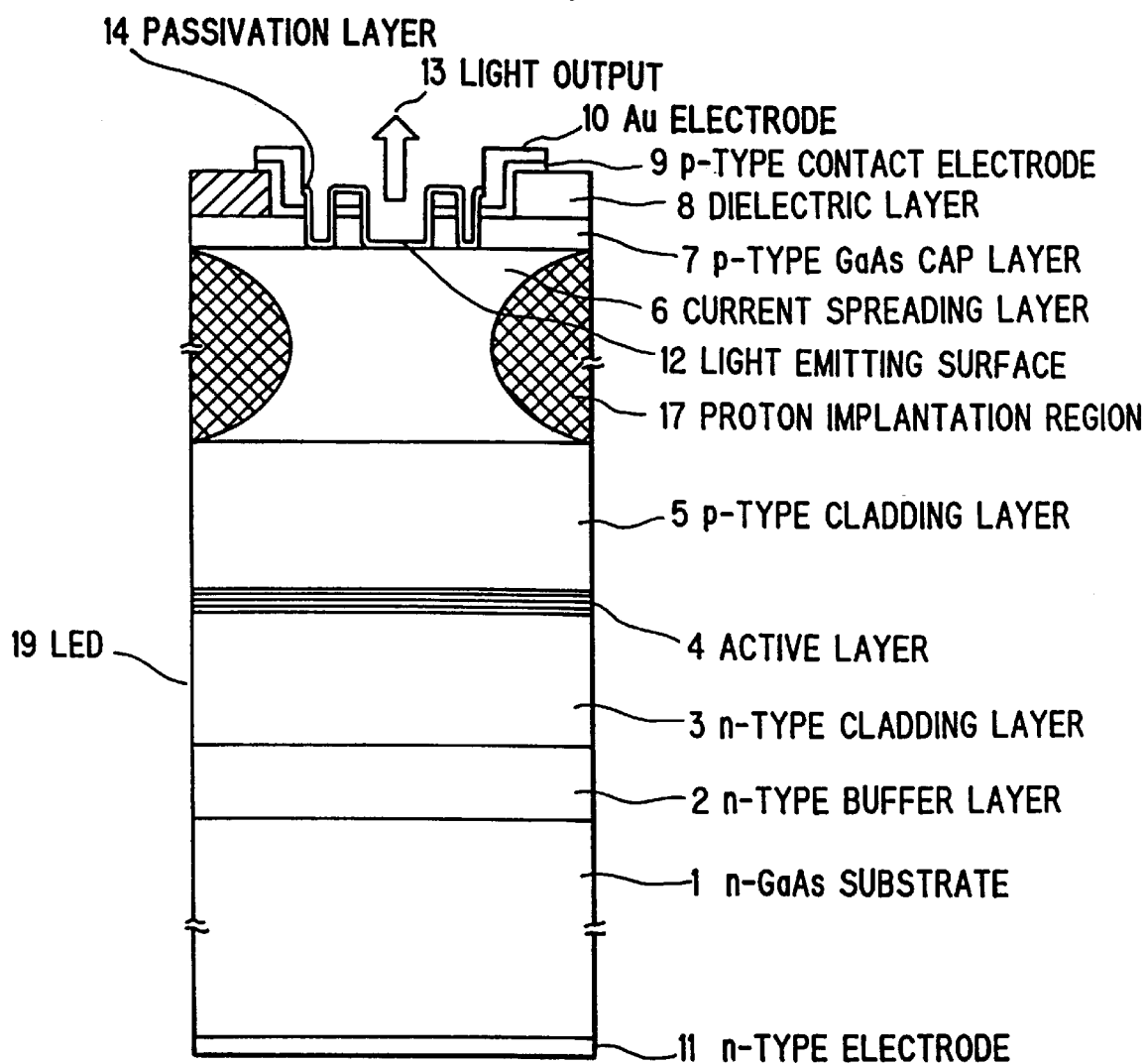
FIG. 10 is a cross sectional view showing a surface emitting visible LED in a fifth preferred embodiment according to the invention.

FIG. 10 shows a surface emitting visible light emitting diode in the fifth preferred embodiment according to the invention, wherein like parts are indicated by like reference numerals as used in FIGS. 4, 6, 7 and 9, so that repeated explanation is omitted here.

In the fifth embodiment, prior to the deposition of a dielectric layer 8 such as silicon dioxide or silicon nitride, proton implantation 17 is done after covering a light emitting surface 12 with thick resist. The proton implantation is performed to make a high resistive region at a portion 18 in order to prevent the current from spreading under the wire bonding region 18. If a thick spreading layer 6 is used, the current would be distributed up to the region 18 and the external efficiency would not be improved as much. The ion implantation along with a blocking layer can improve the external quantum efficiency. The process following this step is the same as described in the first embodiment, so that repeated explanation is omitted here.

Figure 11:
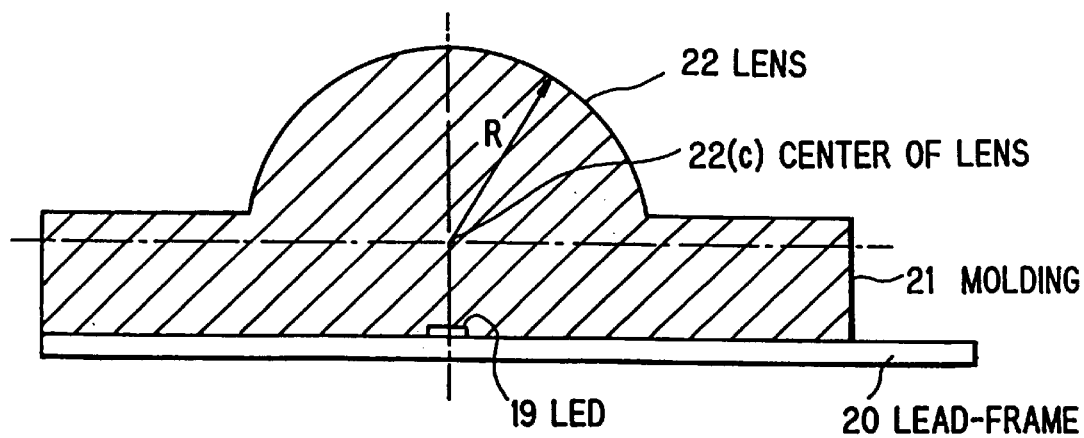
FIG. 11 is a cross sectional view showing a mold package structure for a surface emitting visible LED in a sixth preferred embodiment according to the invention.

FIG. 11 shows a mold package structure for a surface emitting visible light emitting diode in the sixth preferred embodiment according to the invention, wherein the parts used for LED 19 in any of the first to fifth embodiments may similarly be used, so that repeated explanation is omitted here.

In the sixth embodiment, after bonding LED 19 on a lead-frame 20, a molding 21 is formed to facilitate the coupling to the POF fiber. A lens 22 is formed during forming the molding 21. To improve the coupling efficiency and also reduce the packaging cost, the lens 22 to be used is also made of the same type of material as used in the molding 21.

In the POF based system application, the lens 22 with a radius R needs to be $\leq 0.6$ mm and the distance between the center 22c of the lens 22 and LED 19 needs to be as short as 0.75 mm. The material used for the molding 21 needs to have a refractive index $n \leq 1.60$ and needs to be processed at a temperature less than 200° C. When LED 19 on which this mold structure is formed is coupled to a step index(SI) POF fiber with a numerical aperture(NA) of 0.5 and a core diameter of 0.98 mm, the coupling efficiency can be increased more than 70%.

Figure 12A:
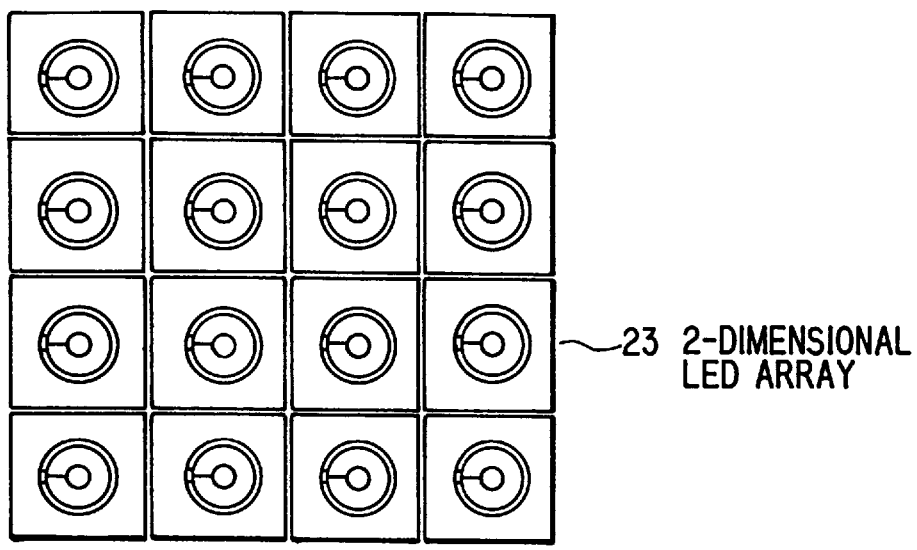
FIGS. 12A and 12B are top views showing surface emitting visible LED arrays in a seventh preferred embodiment according to the invention.
Figure 12B:
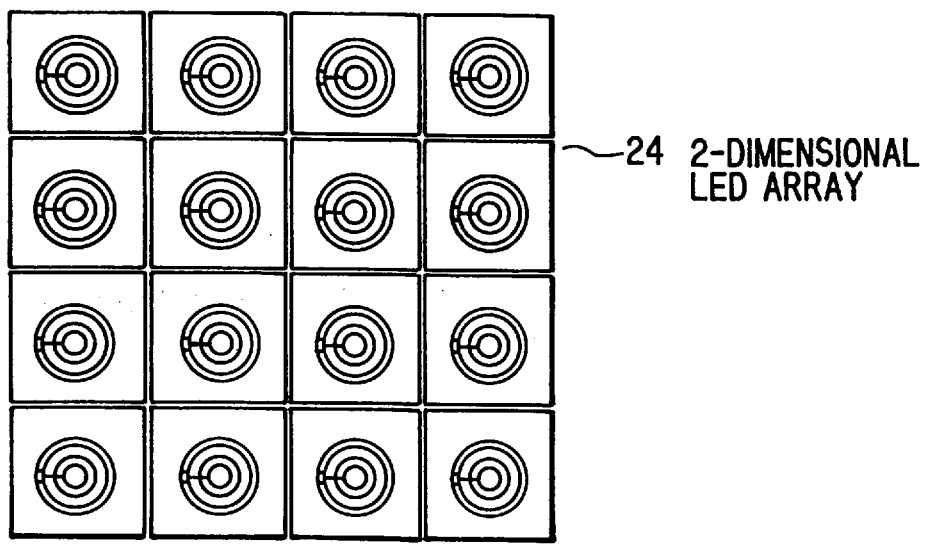

FIGS. 12A and 12B are top views showing LED arrays in the seventh preferred embodiment according to the invention, wherein the parts used for LED 19 in any of the first to sixth embodiments may similarly be used, so that repeated explanation is omitted here.

In the seventh embodiment, a desired number of surface emitting visible LEDs are arranged in the form of a 1-dimensional or a 2-dimensional array 23, 24 as shown in FIG. 12A or 12B. It can be useful not only for the large channel optical data link system but also for various applications such as a printer or display system. Since each surface emitting visible LED 19 uses a ring shaped electrode (s), a large number of LEDs 19 can be arranged in a small area. The process needed are the same as explained in the first embodiment, so that repeated explanation are omitted here.

Figure 13:
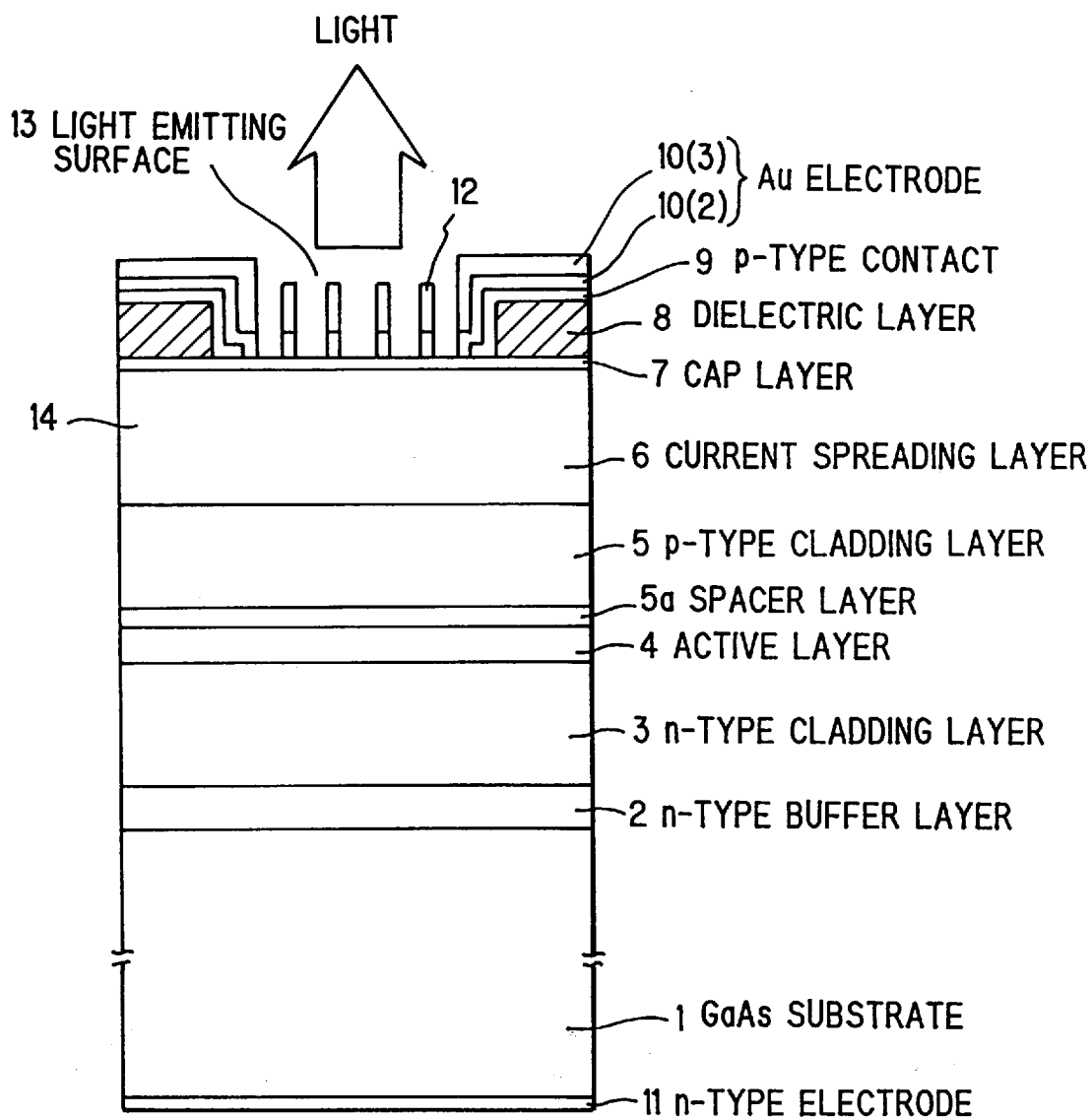
FIG. 13 is a cross sectional view showing a surface emitting visible LED in an eighth preferred embodiment according to the invention.

FIG. 13 shows a surface emitting visible LED in the eighth preferred embodiment according to the invention. As shown in FIG. 13, n-type GaAs buffer layer 2, n-type $(Al_{0.7}Ga_{0.3})_{0.5}In_{0.5}P$ cladding layer 3, active layer 4, non-doped $(Al_{0.7}Ga_{0.5})_{0.5}In_{0.5}P$ spacer layer 5a, p-type $(Al_{0.7}Ga_{0.3})_{0.5}In_{0.5}P$ cladding layer 5, current spreading layer 6 and high doped p-type GaAs cap layer 7 are in turn grown on a n-type GaAs substrate 1. As the active layer 4, bulk or multiquantum well of $(Al_xGa_{1-x})_{0.5}In_{0.5}P$ based material with a desired wavelength can be used. As the current spreading layer 6, high doped p-type III-V based semiconductors having a bandgap higher than that of used as the active layer 4 and also having a lattice constant similar to that of its underlying p-type cladding layer 5 can be used.

It should be noted here that since the high doping is necessary in the thick current spreading layer 6 and cap layer 7 during the epitaxial growth, the dopant diffusion into the active layer 4 may deteriorate the optical characteristics of LED. In order to prevent the dopant from diffusing into the active layer 4, the low doped spacer layer 5a with a thickness dependent on the thickness of the current spreading layer 6 and cap layer 7 is formed following the formation of the active layer 4. As the spacer layer 5a, the same type of low doped materials as the p-type cladding layer 5 can be used. The thickness of the high-doped cap layer 7 used for the contact needs to be ≦100 Å in order to reduce the absorbance of the emitting light.

After the epitaxial growth, a dielectric layer 8 of silicon nitride, silicon dioxide or the like is deposited at a temperature below 400° C. This layer also acts as a passivation layer. To reduce the reflection effect due to the refractive index difference between semiconductor and air, the thickness of the dielectric layer 8 needs to be nλ/4, where n is an integer(n=1,2,3, . . . ) and λ is an emission wavelength.

Then, a window is opened through the dielectric layer 8 to provide a contact 9 and a light emitting surface 13. The p-type contact electrode 9 is then formed using the lift-off process. For the p-type contact electrode 9, Au:Zn, Ti/Pt/Au or Cr/Au can be used. In this case, no additional process for forming the passivation layer is necessary, resulting in reduced fabrication cost. After making p-contact 9, to facilitate the wire bonding, Au electrode 10(2) is plated on the p-contact or partially on the portion where the wire bonding is to be made. When the thick Au electrode 10(2) is used during the formation of the p-contact 9, additional Au-plating is not necessary.

Then, the backside of the substrate 1 is polished to around 100 μm to make a n-type electrode 11. For the n-type electrode 11, Au:Ge/Ni/Au can be used.

After making the n-type electrode 11, each LED is scribed for the packaging.

Figure 14:
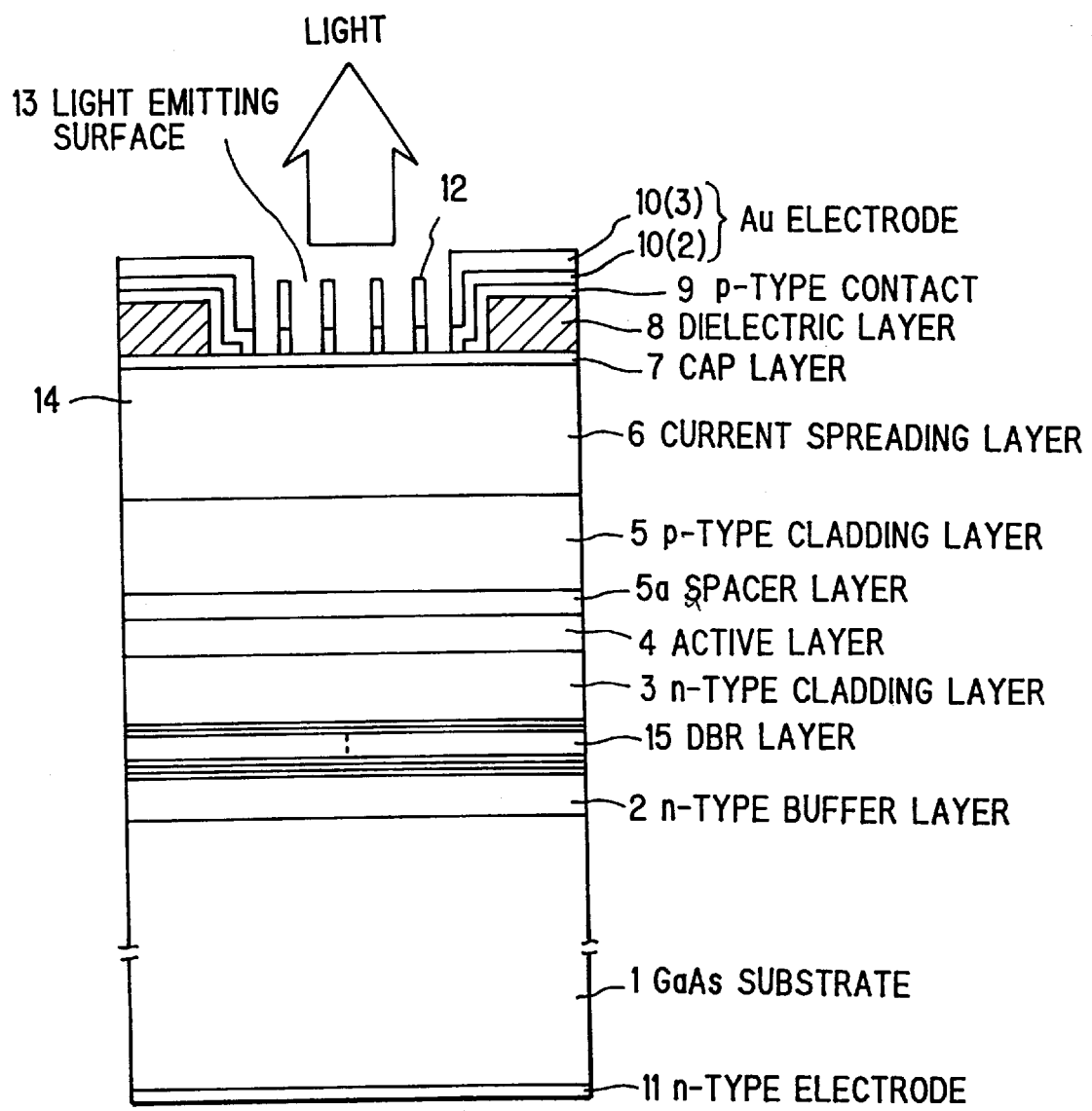
FIG. 14 is a cross sectional view showing a surface emitting visible LED in a ninth preferred embodiment according to the invention.

FIG. 14 shows a surface emitting visible LED in the ninth preferred embodiment according to the invention, wherein like parts are indicated by the like reference numerals in FIG. 13, so that repeated explanation is omitted here. In the ninth embodiment, n-type distributed Bragg reflector(DBR) mirror 15 is grown on the n-buffer layer 2 before growing the cladding layer 3. The other process following this step are the same as described in the eighth embodiment, so that repeated explanation is omitted here.

Figure 15:
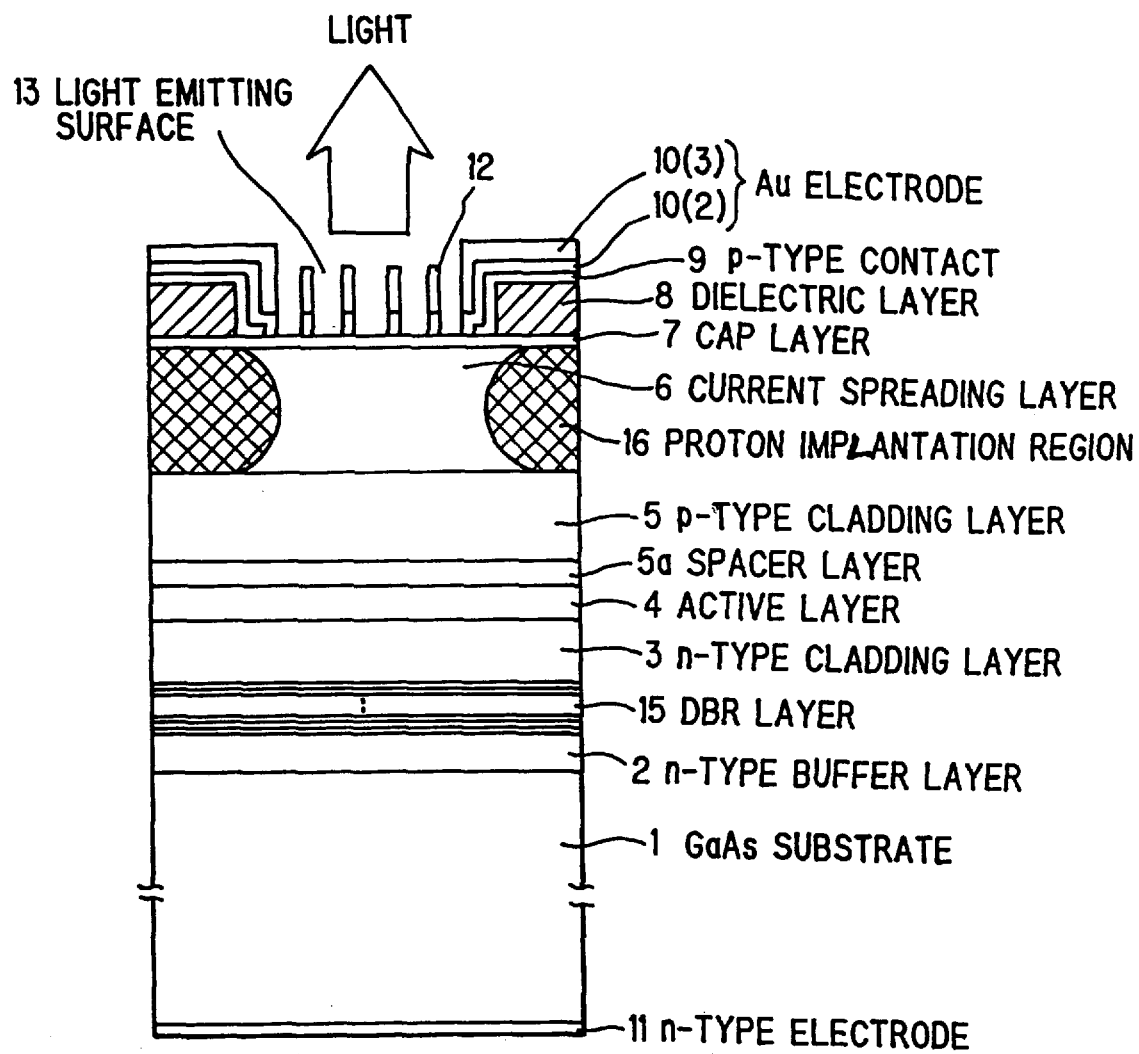
FIG. 15 is a cross sectional view showing a surface emitting visible LED in a tenth preferred embodiment according to the invention.

FIG. 15 shows a surface emitting visible LED in the tenth preferred embodiment according to the invention, wherein like parts are indicated by the like reference numerals in FIG. 13, so that repeated explanation is omitted here. In the tenth embodiment, prior to the deposition of a dielectric layer 8, a proton implantation region 16 is formed after covering a light emitting surface 13 by thick resist. The proton implantation region 16 is provided to make a high resistive region at 14 to prevent the current from spreading under a wire bonding region 14. When a thick current spreading layer 6 is used, the current will be distributed up to the region 14 to reduce the external efficiency. The process following this step is the same as described in the eighth embodiment, so that repeated explanation is omitted here.

Figure 16:
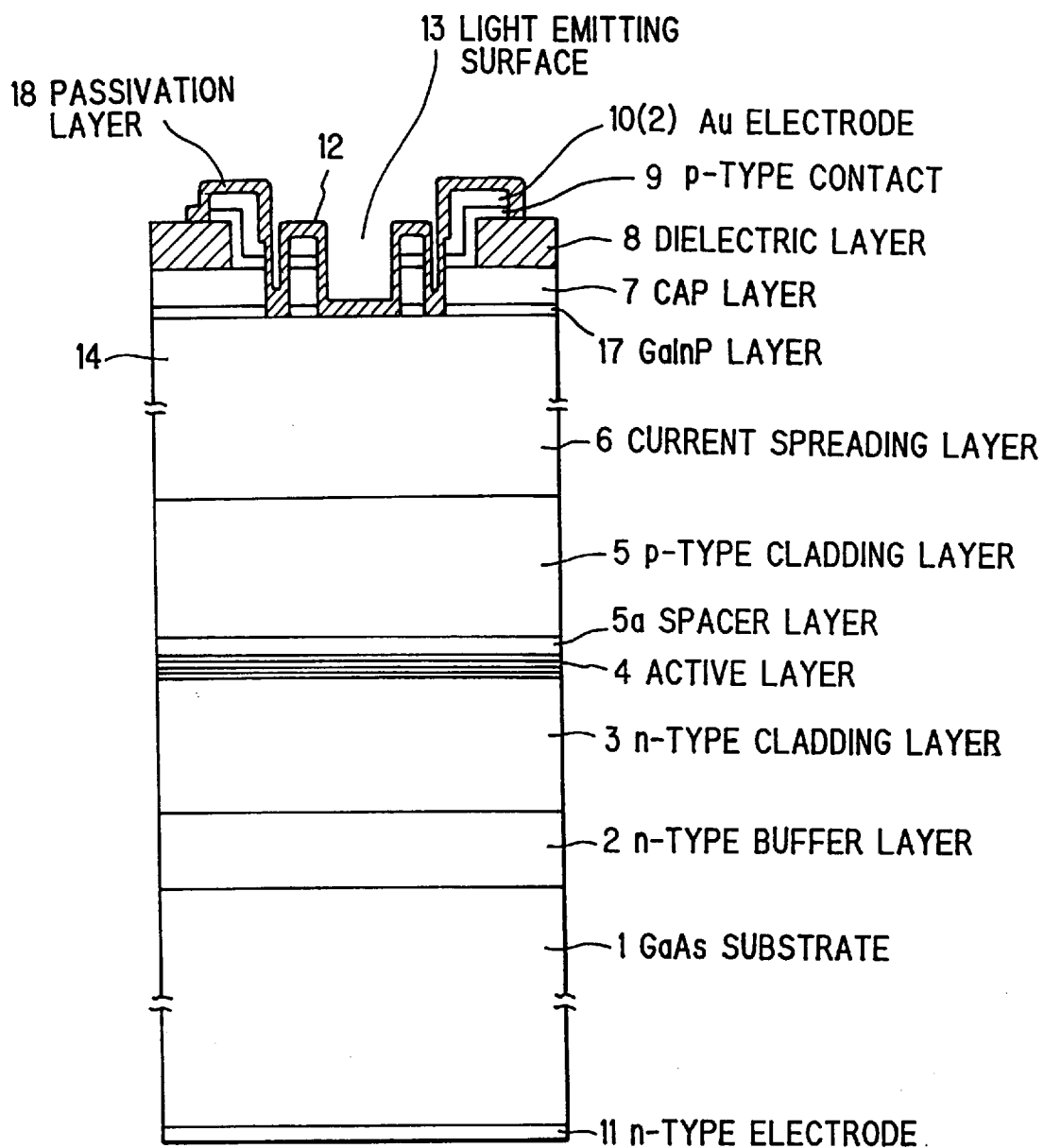
FIG. 16 is a cross sectional view showing a surface emitting visible LED in an eleventh preferred embodiment according to the invention.

FIG. 16 shows a surface emitting visible LED in the eleventh preferred embodiment according to the invention, wherein like parts are indicated by the like reference numerals in FIG. 13, so that repeated explanation is omitted here. In the eleventh embodiment, a GaInP layer 17 with thickness of ≦200 ∈ is grown prior to a cap layer 7 which is over 1000 Å. The GaInP layer 17 is non-doped or low-doped and acts as an etch stopper during the cap layer 7 etching from a light emitting surface 13. Here, an additional process for etching dielectric material 8 from the light emitting surface 13 is essential which is done after the deposition of the dielectric material 8. The process for forming a passivation layer 18 on the light emitting surface 13 is also required in this LED. The other process following this step is the same as described in the eighth embodiment, so that repeated explanation is omitted here.

Figure 17:
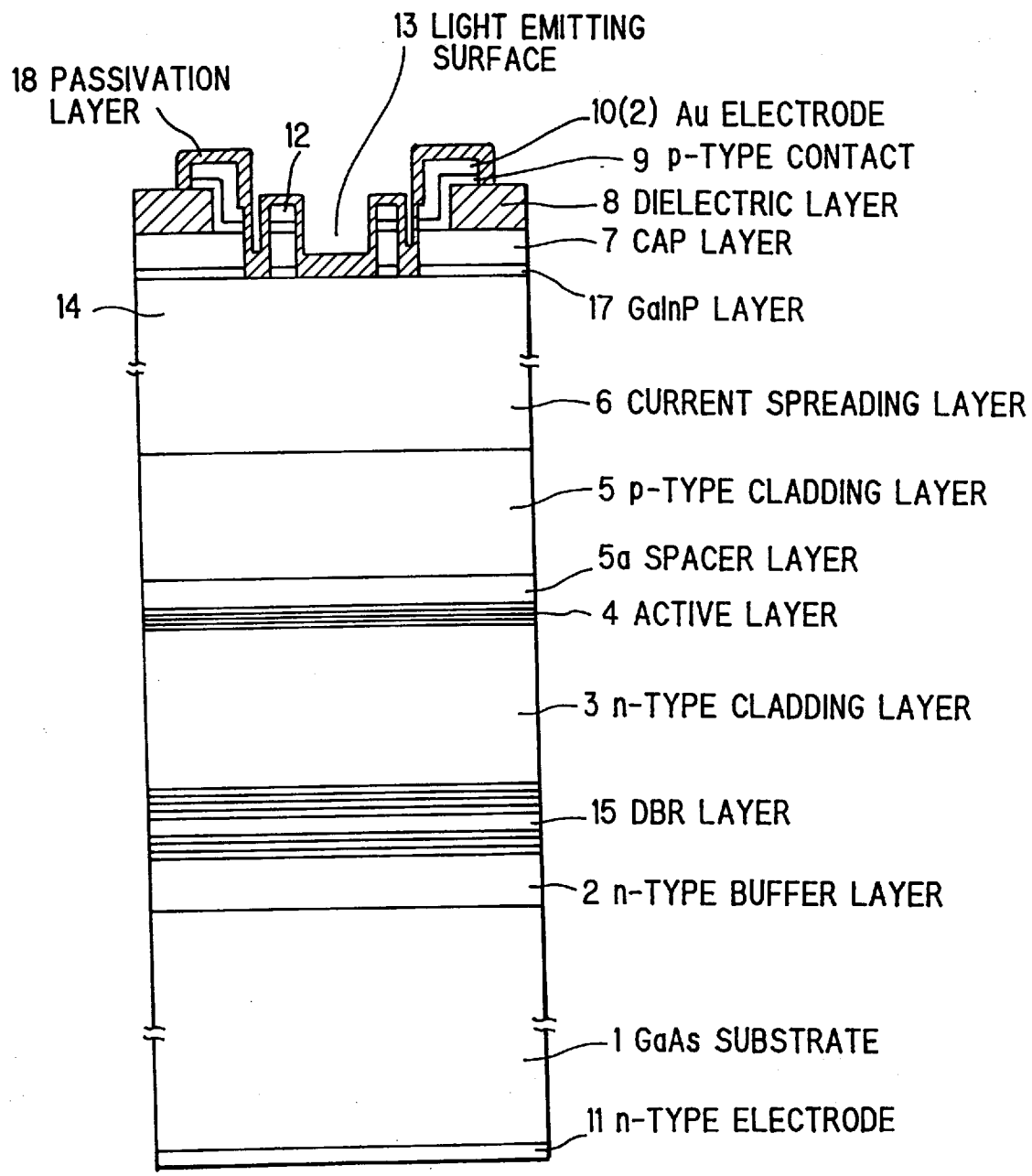
FIG. 17 is a cross sectional view showing a surface emitting visible LED in a twelfth preferred embodiment according to the invention.

FIG. 17 shows a surface emitting visible LED in the twelfth preferred embodiment according to the invention, wherein like parts are indicated by the like reference numerals in FIG. 13, so that repeated explanation is omitted here. In the twelfth embodiment, a n-type distributed Bragg reflector(DBR) mirror 15 is grown on a n-type buffer layer 2 before growing a cladding layer 3. The other process following this step is the same as described in the eighth embodiment, so that repeated explanation is omitted here.

Figure 18:
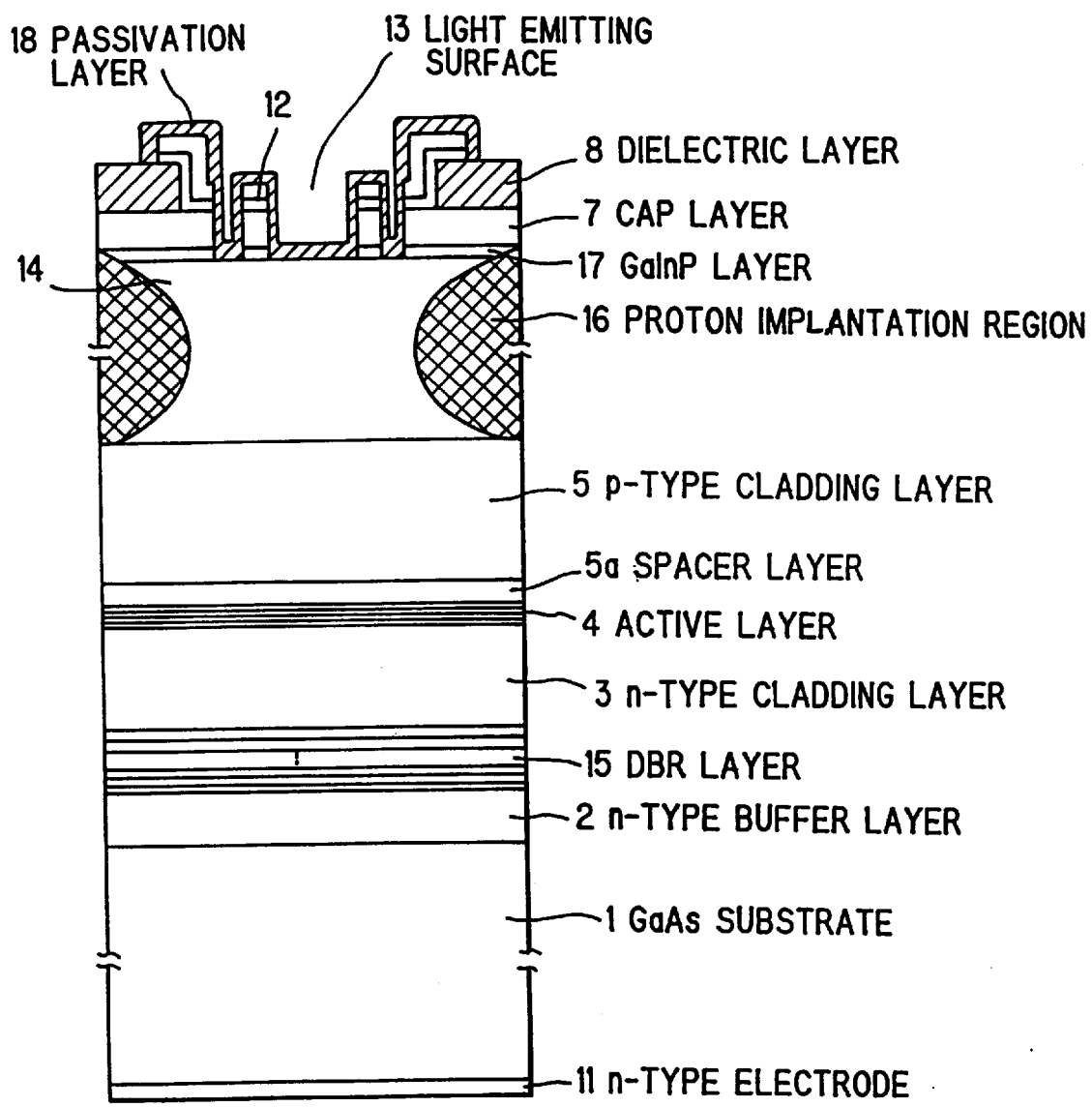
FIG. 18 is a cross sectional view showing a surface emitting visible LED in a thirteenth preferred embodiment according to the invention.

FIG. 18 shows a surface emitting visible LED in the thirteenth preferred embodiment according to the invention, wherein like parts are indicated by the like reference numerals in FIG.13, so that repeated explanation is omitted here. In the thirteenth embodiment, prior to the deposition of a dielectric layer 8, a proton implantation region 16 is formed after covering a light emitting surface 13 by thick resist. The proton implantation region 16 is provided to make a high resistive region at 14 to prevent the current from spreading under a wire bonding region 14. The other process following this step is the same as described in the eighth embodiment, so that repeated explanation is omitted here.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A surface emitting visible light emitting diode, comprising:
   a first conductivity-type substrate; and
   a first conductivity-type buffer layer,
   a first conductivity-type cladding layer,
   an active layer,
   a second conductivity-type cladding layer,
   a second conductivity-type current spreading layer, and
   a second conductivity-type cap layer, which are in turn grown on said substrate;
   wherein said second conductivity-type cap layer has a ring shaped electrode formed thereon; and
   wherein a diameter of said ring shaped electrode, which is based on a numerical aperture and a core diameter of a coupled optical fiber, is such that a coupling efficiency of said ring shaped electrode of said diode to said coupled optical fiber is greater than 50%;
   a lead-frame for mounting said surface emitting visible light emitting diode; and
   a molding with a lens formed on said lead-frame, said molding having a refractive index of 1.6 or less.

2. A surface emitting visible light emitting diode, comprising:
- a first conductivity-type substrate; and
- a first conductivity-type buffer layer,
- a first conductivity-type cladding layer,
- an active layer,
- a second conductivity-type cladding layer,
- a second conductivity-type current spreading layer, and
- a second conductivity-type cap layer, which are in turn grown on said substrate;
- wherein said second conductivity-type cap layer has a ring shaped electrode formed thereon; and
- wherein a diameter of said ring shaped electrode, which is based on a numerical aperture and a core diameter of a coupled optical fiber, is such that a coupling efficiency of said ring shaped electrode of said diode to said coupled optical fiber is greater than 50%;
- wherein said ring shaped electrode is composed by two or more rings;
- a lead-frame for mounting said surface emitting visible light emitting diode; and
- a molding with a lens formed on said lead-frame, said molding having a refractive index of 1.6 or less.

* * * * *

UNITED STATES PATENT AND TRADEMARK OFFICE
CERTIFICATE OF CORRECTION

PATENT NO. : 5,861,636
DATED : January 19, 1999
INVENTOR(S) : Dutta et al.

It is certified that error appears in the above-identified patent and that said Letters Patent is hereby corrected as shown below:

Col. 10, line 3, delete "E" and insert -- $\overset{o}{A}$ --.

Signed and Sealed this

Fourteenth Day of December, 1999

Attest:

Q. TODD DICKINSON

*Attesting Officer*   *Acting Commissioner of Patents and Trademarks*